United States Patent
Hunt

(10) Patent No.: US 9,343,592 B2
(45) Date of Patent: May 17, 2016

(54) ELECTRICAL INTERCONNECTS FOR PHOTOVOLTAIC MODULES AND METHODS THEREOF

(75) Inventor: Thomas Peter Hunt, Oakland, CA (US)

(73) Assignee: Alion Energy, Inc., Richmond, CA (US)

( * ) Notice: Subject to any disclaimer, the term of this patent is extended or adjusted under 35 U.S.C. 154(b) by 189 days.

(21) Appl. No.: 13/195,562

(22) Filed: Aug. 1, 2011

(65) Prior Publication Data

US 2012/0034799 A1 Feb. 9, 2012

Related U.S. Application Data

(60) Provisional application No. 61/370,369, filed on Aug. 3, 2010.

(51) Int. Cl.
*H02N 6/00* (2006.01)
*H01L 31/042* (2014.01)
*H01L 31/02* (2006.01)
(Continued)

(52) U.S. Cl.
CPC ........ *H01L 31/02013* (2013.01); *H01L 31/048* (2013.01); *H02S 40/36* (2014.12); *Y02E 10/50* (2013.01); *Y10T 29/49355* (2015.01); *Y10T 29/49826* (2015.01)

(58) Field of Classification Search
CPC . H01L 31/0201; H01L 31/0485; H01L 31/05; H01L 31/0504; H01L 31/0508; H01L 31/02013; H02S 40/36; H02S 40/34
See application file for complete search history.

(56) References Cited

U.S. PATENT DOCUMENTS

| 3,334,217 A | 1/1967 | Bickler et al. |
| 3,951,506 A * | 4/1976 | Bennett et al. ................ 439/452 |
| 4,145,021 A | 3/1979 | Gaechter et al. |

(Continued)

FOREIGN PATENT DOCUMENTS

| CN | 101858659 | 10/2010 |
| CN | 202019322 | 10/2011 |

(Continued)

OTHER PUBLICATIONS

Patent Cooperation Treaty, International Search Report for corresponding application PCT/US2011/046175, mailed Dec. 9, 2011.

(Continued)

*Primary Examiner* — Eli Mekhlin
(74) *Attorney, Agent, or Firm* — Jones Day

(57) ABSTRACT

System and method for interconnecting photovoltaic modules. The system includes a first photovoltaic module and a second photovoltaic module. The first photovoltaic module includes a first bus bar and a first interconnect tab connected to the first bus bar. The second photovoltaic module includes a second bus bar and a second interconnect tab connected to the second bus bar. The system for interconnecting photovoltaic modules additionally includes a module interconnector configured to interconnect the first and the second photovoltaic modules. The module interconnector includes an interconnection component and an interconnection protector. Additionally, the system for interconnecting photovoltaic modules includes a first connection component connecting the interconnection component to the first interconnect tab of the first photovoltaic module and a second connection component connecting the interconnection component to the second interconnect tab of the second photovoltaic module.

25 Claims, 8 Drawing Sheets

(51) Int. Cl.
*H01L 31/048* (2014.01)
*H02S 40/36* (2014.01)

(56) References Cited

U.S. PATENT DOCUMENTS

| | | |
|---|---|---|
| 4,219,926 A | 9/1980 | Bloch et al. |
| 4,279,347 A | 7/1981 | Appleman et al. |
| 4,290,416 A | 9/1981 | Maloney et al. |
| 4,296,270 A * | 10/1981 | Kohler .................. 136/244 |
| 4,301,322 A * | 11/1981 | Amick .................. 136/256 |
| 4,301,409 A | 11/1981 | Miller et al. |
| 4,371,139 A | 2/1983 | Clark |
| 4,421,943 A | 12/1983 | Withjack et al. |
| 4,496,063 A | 1/1985 | Ishii et al. |
| 4,664,270 A | 5/1987 | Voelz |
| 4,667,834 A | 5/1987 | Lanigan et al. |
| 4,676,713 A | 6/1987 | Voelpel |
| 4,706,825 A | 11/1987 | Johnson |
| 4,876,143 A | 10/1989 | Sugita et al. |
| 4,877,365 A | 10/1989 | Lanigan Jr. et al. |
| 4,880,346 A | 11/1989 | Brassette et al. |
| 4,995,377 A | 2/1991 | Eiden et al. |
| 5,125,608 A | 6/1992 | McMaster et al. |
| 5,143,556 A | 9/1992 | Matlin |
| 5,152,109 A | 10/1992 | Boers |
| 5,228,924 A | 7/1993 | Barker et al. |
| 5,232,519 A | 8/1993 | Glatfelter et al. |
| 5,257,891 A | 11/1993 | Baumann et al. |
| 5,361,704 A | 11/1994 | Bounds |
| 5,460,660 A | 10/1995 | Albright et al. |
| 5,501,744 A | 3/1996 | Albright et al. |
| 5,505,788 A | 4/1996 | Dinwoodie |
| 5,568,713 A | 10/1996 | Gagne et al. |
| 5,593,901 A | 1/1997 | Oswald et al. |
| 5,715,958 A | 2/1998 | Feider et al. |
| 5,800,631 A * | 9/1998 | Yamada et al. .......... 136/251 |
| 5,816,769 A | 10/1998 | Bauer et al. |
| 5,826,734 A | 10/1998 | Baumann et al. |
| 6,037,578 A | 3/2000 | Grandjean et al. |
| 6,058,930 A | 5/2000 | Shingleton |
| 6,111,189 A | 8/2000 | Garvison et al. |
| 6,201,181 B1 | 3/2001 | Azzam et al. |
| 6,233,502 B1 | 5/2001 | Yim |
| 6,495,750 B1 | 12/2002 | Dinwoodie |
| 6,639,421 B1 | 10/2003 | Yoshino et al. |
| 6,730,841 B2 | 5/2004 | Heckeroth |
| 6,809,251 B2 | 10/2004 | Dinwoodie |
| 7,086,675 B2 | 8/2006 | Jacobs |
| 7,252,083 B2 | 8/2007 | Hayden |
| 7,309,850 B2 | 12/2007 | Sinton et al. |
| 7,374,137 B2 | 5/2008 | Staney |
| 7,411,408 B2 | 8/2008 | Shimotomai et al. |
| 7,476,832 B2 | 1/2009 | Vendig et al. |
| 7,492,120 B2 | 2/2009 | Benn et al. |
| 7,531,741 B1 | 5/2009 | Melton et al. |
| 7,546,929 B2 | 6/2009 | Wierzba et al. |
| 7,712,807 B2 | 5/2010 | Perlman et al. |
| 7,799,987 B1 | 9/2010 | Hines et al. |
| 7,814,899 B1 | 10/2010 | Port |
| 7,888,588 B2 | 2/2011 | Shingleton |
| 7,898,212 B2 | 3/2011 | Benn et al. |
| 7,963,578 B2 | 6/2011 | Wells et al. |
| 8,006,624 B2 | 8/2011 | Sin |
| 8,203,237 B1 | 6/2012 | Cowles |
| 8,371,076 B2 | 2/2013 | Jones et al. |
| 8,407,950 B2 | 4/2013 | Hartelius |
| 8,464,496 B2 | 6/2013 | Cusson et al. |
| 8,492,645 B1 | 7/2013 | Strahm |
| 8,500,918 B1 | 8/2013 | Meller et al. |
| 8,550,419 B2 | 10/2013 | Hausner et al. |
| 8,573,545 B2 | 11/2013 | Walquist et al. |
| 8,578,928 B2 | 11/2013 | Lumbreras |
| 8,609,977 B2 | 12/2013 | Jones et al. |
| 8,635,818 B2 | 1/2014 | Wildes |
| 8,657,991 B2 | 2/2014 | Potter et al. |
| 8,752,343 B2 | 6/2014 | Kuan et al. |
| 2003/0075211 A1 | 4/2003 | Makita et al. |
| 2005/0061360 A1 * | 3/2005 | Horioka et al. .......... 136/244 |
| 2005/0268959 A1 | 12/2005 | Aschenbrenner et al. |
| 2006/0054162 A1 | 3/2006 | Romeo |
| 2006/0174931 A1 | 8/2006 | Mapes et al. |
| 2006/0290344 A1 | 12/2006 | Shimotomai et al. |
| 2007/0012352 A1 * | 1/2007 | Wohlgemuth et al. ........ 136/251 |
| 2007/0215145 A1 | 9/2007 | Hayden |
| 2007/0283996 A1 | 12/2007 | Hachtmann et al. |
| 2008/0010915 A1 | 1/2008 | Liebendorfer |
| 2008/0023069 A1 * | 1/2008 | Terada et al. .................. 136/256 |
| 2008/0053517 A1 | 3/2008 | Plaisted et al. |
| 2008/0087320 A1 | 4/2008 | Mapes et al. |
| 2008/0099063 A1 | 5/2008 | Armstrong et al. |
| 2008/0121273 A1 | 5/2008 | Plaisted et al. |
| 2008/0135084 A1 | 6/2008 | Scharlack |
| 2008/0156365 A1 * | 7/2008 | Scholz et al. .................. 136/251 |
| 2008/0233429 A1 | 9/2008 | Oguma et al. |
| 2008/0271774 A1 * | 11/2008 | Kalkanoglu et al. .......... 136/244 |
| 2008/0306700 A1 | 12/2008 | Kawam et al. |
| 2009/0014057 A1 | 1/2009 | Croft et al. |
| 2009/0032100 A1 | 2/2009 | Oak |
| 2009/0114261 A1 * | 5/2009 | Stancel et al. .................. 136/244 |
| 2009/0139557 A1 | 6/2009 | Rose et al. |
| 2009/0173831 A1 | 7/2009 | Roseman |
| 2009/0191030 A1 | 7/2009 | Bluck et al. |
| 2009/0205270 A1 | 8/2009 | Shaw et al. |
| 2009/0223142 A1 | 9/2009 | Shingleton et al. |
| 2009/0260671 A1 | 10/2009 | Green et al. |
| 2009/0282755 A1 | 11/2009 | Abbott et al. |
| 2009/0293932 A1 | 12/2009 | Augenbraun et al. |
| 2009/0293941 A1 | 12/2009 | Luch |
| 2009/0308430 A1 | 12/2009 | Everett et al. |
| 2010/0031996 A1 | 2/2010 | Basol |
| 2010/0043781 A1 | 2/2010 | Jones et al. |
| 2010/0108118 A1 | 5/2010 | Luch |
| 2010/0127142 A1 | 5/2010 | Genschorek |
| 2010/0147286 A1 | 6/2010 | Xiang et al. |
| 2010/0175337 A1 | 7/2010 | Mascolo et al. |
| 2010/0175738 A1 | 7/2010 | Huss et al. |
| 2010/0206294 A1 | 8/2010 | Blair et al. |
| 2010/0252092 A1 | 10/2010 | Lenox |
| 2010/0269888 A1 | 10/2010 | Johnston, Jr. |
| 2010/0275975 A1 | 11/2010 | Monschke et al. |
| 2010/0281791 A1 | 11/2010 | Intagliata et al. |
| 2010/0319277 A1 | 12/2010 | Suarez et al. |
| 2010/0325797 A1 | 12/2010 | Horne |
| 2011/0126378 A1 | 6/2011 | Ota |
| 2011/0126884 A1 | 6/2011 | Dritsas |
| 2011/0162691 A1 | 7/2011 | Hartelius |
| 2011/0173900 A1 | 7/2011 | Plaisted et al. |
| 2011/0183540 A1 * | 7/2011 | Keenihan et al. .............. 439/345 |
| 2011/0194900 A1 | 8/2011 | French |
| 2011/0264306 A1 | 10/2011 | Bagge |
| 2011/0284057 A1 | 11/2011 | Swahn et al. |
| 2011/0309215 A1 | 12/2011 | Lu et al. |
| 2012/0027550 A1 | 2/2012 | Bellacicco et al. |
| 2012/0034799 A1 | 2/2012 | Hunt |
| 2012/0037214 A1 | 2/2012 | Sagayama |
| 2012/0056638 A1 | 3/2012 | Swahn |
| 2012/0067738 A1 | 3/2012 | Field |
| 2012/0090176 A1 | 4/2012 | Stancel et al. |
| 2012/0131866 A1 | 5/2012 | Batut |
| 2012/0132246 A1 | 5/2012 | Hunt et al. |
| 2012/0198682 A1 | 8/2012 | Potter et al. |
| 2012/0198779 A1 | 8/2012 | Tachino |
| 2012/0199266 A1 | 8/2012 | Potter et al. |
| 2013/0068275 A1 | 3/2013 | Swahn et al. |
| 2013/0133172 A1 | 5/2013 | Kiener et al. |
| 2013/0180568 A1 | 7/2013 | Hartelius |
| 2013/0206206 A1 | 8/2013 | Bjorneklett et al. |
| 2013/0248478 A1 | 9/2013 | Wheeler et al. |
| 2013/0305518 A1 | 11/2013 | Adriani et al. |
| 2013/0319962 A1 | 12/2013 | Park et al. |
| 2014/0033511 A1 | 2/2014 | Swahn et al. |
| 2014/0069483 A1 | 3/2014 | Wolter et al. |

(56) References Cited

U.S. PATENT DOCUMENTS

| | | | |
|---|---|---|---|
| 2015/0069001 | A1 | 3/2015 | French et al. |
| 2015/0144156 | A1 | 5/2015 | French et al. |

FOREIGN PATENT DOCUMENTS

| | | |
|---|---|---|
| DE | 102009049926 | 4/2011 |
| EP | 2505934 | 10/2012 |
| FR | 2959555 | 11/2011 |
| WO | WO 2006/117551 | 9/2006 |
| WO | WO 2010/054274 | 5/2010 |
| WO | WO 2010/145844 | 12/2010 |
| WO | WO 2012/003585 | 1/2012 |

OTHER PUBLICATIONS

Patent Cooperation Treaty, Written Opinion of the International Searching Authority for corresponding application PCT/US2011/046175, mailed Dec. 9, 2011.
Patent Cooperation Treaty, International Search Report for PCT/US11/027700 mailed May 3, 2011 (2 pages).
Patent Cooperation Treaty, Written Opinion of the International Searching Authority for PCT/US11/027700 mailed May 3, 2011 (4 pages).
Patent Cooperation Treaty, International Search Report for PCT/US11/033722 mailed Jul. 28, 2011 (2 pages).
Patent Cooperation Treaty, Written Opinion of the International Searching Authority for PCT/US11/033722 mailed Jul. 28, 2011 (9 pages).
Patent Cooperation Treaty, International Search Report for PCT/US11/038094 mailed Sep. 2, 2011 (2 pages).
Patent Cooperation Treaty, Written Opinion of the International Searching Authority for PCT/US11/038094 mailed Sep. 2, 2011 (12 pages).
Patent Cooperation Treaty, International Search Report for PCT/US12/029345 mailed Oct. 10, 2012 (4 pages).
Patent Cooperation Treaty, Written Opinion of the International Searching Authority for PCT/US12/029345 mailed Oct. 10, 2012 (8 pages).
Patent Cooperation Treaty, International Search Report for PCT/US13/30416 mailed Jun. 17, 2013 (2 pages).
Patent Cooperation Treaty, Written Opinion of the International Searching Authority for PCT/US13/30416 mailed Jun. 17, 2013 (6 pages).
Patent Cooperation Treaty, International Search Report for PCT/US13/40500 mailed Sep. 4, 2013 (2 pages).
Patent Cooperation Treaty, Written Opinion of the International Searching Authority for PCT/US13/40500 mailed Sep. 4, 2013 (9 pages).
United States Patent and Trademark Office, Non final office action dated Nov. 8, 2012 for U.S. Appl. No. 13/043,286 (14 pages).
United States Patent and Trademark Office, Non final office action dated Jan. 10, 2014 for U.S. Appl. No. 13/091,960 (21 pages).
United States Patent and Trademark Office, Non final office action dated Aug. 8, 2013 for U.S. Appl. No. 13/421,740 (9 pages).
United States Patent and Trademark Office, Final office action dated Mar. 24, 2014 for U.S. Appl. No. 13/421,740 (12 pages).
European Patent Office, Extended European Search Report for EP 12760313.2-1605 mailed Mar. 25, 2015 (6 pages).
Patent Cooperation Treaty, International Search Report for PCT/US14/54916 mailed Dec. 24, 2014 (2 pages).
Patent Cooperation Treaty, Written Opinion of the International Searching Authority for PCT/US14/54916 mailed Dec. 24, 2014 (3 pages).
Patent Cooperation Treaty, International Search Report for PCT/US14/53787 mailed Jan. 12, 2015 (2 pages).
Patent Cooperation Treaty, Written Opinion of the International Searching Authority for PCT/US14/53787 mailed Jan. 12, 2015 (7 pages).
United States Patent and Trademark Office, Non final office action dated Nov. 19, 2014 for U.S. Appl. No. 13/091,960 (26 pages).
United States Patent and Trademark Office, Non final office action dated Sep. 24, 2014 for U.S. Appl. No. 13/421,740 (15 pages).
United States Patent and Trademark Office, Non Final office action dated Mar. 25, 2015 for U.S. Appl. No. 13/794,217 (16 pages).
Chinese Patent Office, First Office Action for CN 201280023942.0, mailed Mar. 20, 2015.
United States Patent and Trademark Office, Final office action dated Aug. 26, 2015 for U.S. Appl. No. 13/091,960 (24 pages).
United States Patent and Trademark Office, Final office action dated Apr. 29, 2015 for U.S. Appl. No. 13/421,740 (16 pages).
United States Patent and Trademark Office, Notice of Allowance dated Nov. 3, 2015 for U.S. Appl. No. 13/794,217 (5 pages).
Chinese Patent Office, First Office Action for CN 201380035248.5, mailed Oct. 20, 2015.
United States Patent and Trademark Office, Non-final office action dated Jan. 12, 2016 for U.S. Appl. No. 13/091,960 (22 pages).
United States Patent and Trademark Office, Final office action dated Nov. 20, 2015 for U.S. Appl. No. 13/421,740 (16 pages).
United States Patent and Trademark Office, Non final office action dated Dec. 7, 2015 for U.S. Appl. No. 14/481,678 (7 pages).
United States Patent and Trademark Office, Non final office action dated Dec. 31, 2015 for U.S. Appl. No. 14/050,237 (7 pages).

* cited by examiner

ELECTRICAL INTERCONNECTS FOR PHOTOVOLTAIC MODULES AND METHODS THEREOF

1. CROSS-REFERENCES TO RELATED APPLICATIONS

This application claims priority to U.S. Provisional Application No. 61/370,369, filed Aug. 3, 2010, commonly assigned and incorporated by reference herein for all purposes.

2. BACKGROUND OF THE INVENTION

The present invention is directed to interconnects for photovoltaic modules. More particularly, the invention provides electrical interconnects between conductive tabs for photovoltaic modules and methods thereof. Merely by way of example, the invention has been applied to the interconnection of photovoltaic modules with interconnection protectors. But it would be recognized that the invention has a much broader range of applicability.

A traditional photovoltaic module ("PV module) often is equipped in the factory with two wires and expensive electrical connectors. For example, these expensive electrical connectors might include push-to-connect connectors such as MC-4 compatible connectors. These conventional wires and connectors are then used at the installation site to interconnect PV modules into strings of modules or into larger photovoltaic arrays. The photovoltaic strings and modules are typically mounted in areas where they are exposed to extremes of heat and cold, are subject to thermal cycling, and are subject to hazardous weather conditions such as high winds, rain, sleet, and/or snow. Consequently, the electrical connectors interconnecting the PV modules must be weatherproof for decades, tolerant of thermal cycling, and/or allow for rapid assembly.

To minimize the total cost of a photovoltaic installation, it is often desirable to reduce both the cost of the PV module and the labor required for installation. Although the PV modules need to be weatherproof after final installation at the installation site, the requirements for weatherproofing often are not as stringent between fabrication of the PV module in the factory and installation of the PV module at the installation site. In addition, for large installations, specialized and/or automated interconnection tooling may be used. Thus, improved interconnections between PV modules in a large photovoltaic array can, for example, provide a significant reduction in material, labor, and/or construction costs. In another example, improved interconnections increases the packing density of PV modules reducing the cost of shipping PV modules to the installation site.

Hence, it is highly desirable to improve techniques for interconnecting PV modules so to optimize the hardware and/or the process for electrically interconnecting the PV modules to reduce the total cost of the photovoltaic installation.

3. BRIEF SUMMARY OF THE INVENTION

The present invention is directed to interconnects for photovoltaic modules. More particularly, the invention provides electrical interconnects between conductive tabs for photovoltaic modules and methods thereof. Merely by way of example, the invention has been applied to the interconnection of photovoltaic modules with interconnection protectors. But it would be recognized that the invention has a much broader range of applicability.

According to one embodiment, a system for interconnecting photovoltaic modules includes a first photovoltaic module and a second photovoltaic module. The first photovoltaic module includes a first bus bar and a first interconnect tab connected to the first bus bar. The second photovoltaic module includes a second bus bar and a second interconnect tab connected to the second bus bar. The system for interconnecting photovoltaic modules additionally includes a module interconnector configured to interconnect the first photovoltaic module and the second photovoltaic module. The module interconnector includes an interconnection component and an interconnection protector. Additionally, the system for interconnecting photovoltaic modules includes a first connection component connecting the interconnection component to the first interconnect tab of the first photovoltaic module and a second connection component connecting the interconnection component to the second interconnect tab of the second photovoltaic module. The interconnection protector substantially encloses the interconnection component, the first connection component, and the second connection component.

According to another embodiment, a method for installing photovoltaic modules includes providing a first photovoltaic module that includes a first bus bar, providing a second photovoltaic module that includes a second bus bar, attaching a first interconnect tab to the first bus bar, and attaching a second interconnect tab to the second bus bar. The method for installing photovoltaic modules further includes interconnecting the first photovoltaic module and the second photovoltaic module by connecting the first interconnect tab to an interconnection component with a first connection component and by connecting the second interconnect tab to the interconnection component with a second connection component. The method for installing photovoltaic modules additionally includes enclosing substantially the interconnection component, the first connection component, and the second connection component by an interconnection protector. The method for installing photovoltaic modules additionally includes packing, for shipping, at least the first photovoltaic module and the second photovoltaic module, the first photovoltaic module and the second photovoltaic module being interconnected to each other, shipping, to an installation site, at least the packed first photovoltaic module and second photovoltaic module, the first photovoltaic module and the second photovoltaic module being interconnected to each other, and installing, at the installation site, at least the first photovoltaic module and the second photovoltaic module.

According to yet another embodiment, a method for installing photovoltaic modules includes providing a first photovoltaic module that includes a first bus bar and a first interconnect tab connected to the first bus bar and providing a second photovoltaic module that includes a second bus bar and a second interconnect tab connected to the second bus bar. The method for installing photovoltaic modules further includes coating the first interconnect tab at least partially with a first protective film and coating the second interconnect tab at least partially with a second protective film. The method for installing photovoltaic modules additionally includes packing, for shipping, at least the first photovoltaic module and the second photovoltaic module, shipping, to an installation site, at least the packed first photovoltaic module and second photovoltaic module, and installing, at the installation site, at least the first photovoltaic module and the second photovoltaic module. The method for installing photovoltaic modules additionally includes interconnecting, at the installation site, the installed first photovoltaic module and the installed second photovoltaic module by connecting the first interconnect tab to an interconnection component with a first connection component and by connecting the second interconnect tab to the interconnection component with a second connection component. The method for installing photovoltaic modules additionally includes enclosing substantially the interconnection component, the first connection component, and the second connection component with an interconnection protector.

Depending upon the embodiment, one or more of these benefits may be achieved. These benefits and various additional objects, features, and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to interconnects for photovoltaic modules. More particularly, the invention provides electrical interconnects between conductive tabs for photovoltaic modules and methods thereof. Merely by way of example, the invention has been applied to the interconnection of photovoltaic modules with interconnection protectors. But it would be recognized that the invention has a much broader range of applicability.

Figure 1:
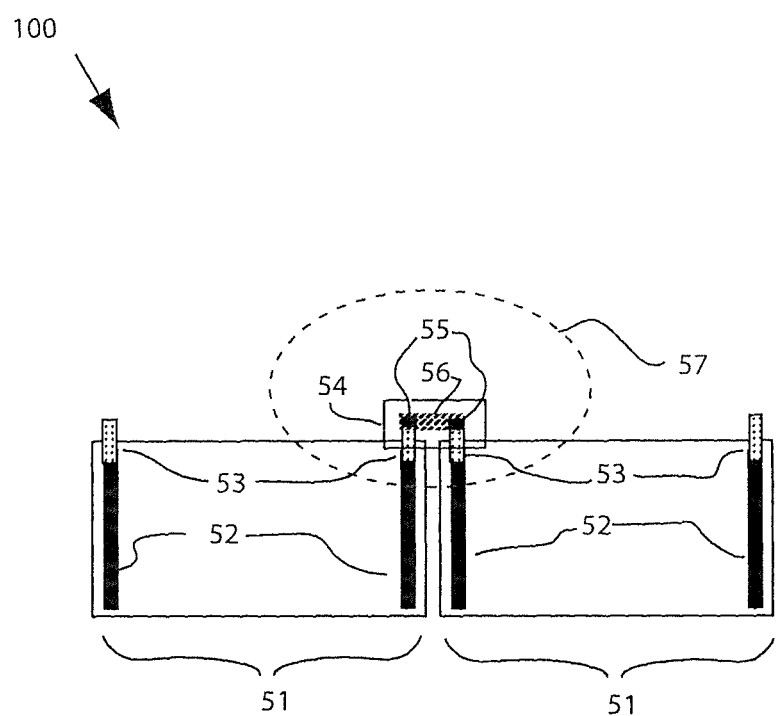
FIG. 1 is a simplified diagram showing a planar view of a photovoltaic module interconnection system according to one embodiment of the present invention.

FIG. 1 is a simplified diagram showing a planar view of a photovoltaic module interconnection system according to one embodiment of the present invention. This diagram is merely an example, which should not unduly limit the scope of the claims. One of ordinary skill in the art would recognize many variations, alternatives, and modifications. In FIG. 1, the photovoltaic interconnection system 100 includes a plurality of PV modules 51. In one example, the PV modules 51 are interconnected to neighboring PV modules 51 using an interconnection system. In another example, each of the plurality of PV modules 51 includes a plurality of bus bars 52 and/or a plurality of interconnect tabs 53. In yet another example, a first PV module 51 and a second PV module 51 are interconnected using a module interconnector 57.

Figure 2:
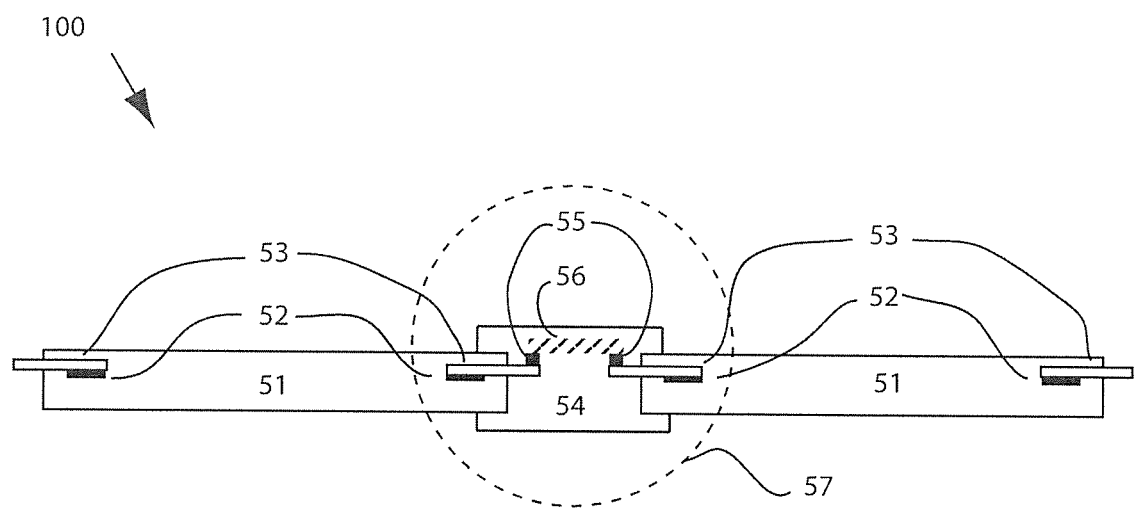
FIG. 2 is a simplified diagram showing a side view of the photovoltaic module interconnection system according to one embodiment of the present invention.

FIG. 2 is a simplified diagram showing a side view of the photovoltaic module interconnection system 100 according to one embodiment of the present invention. This diagram is merely an example, which should not unduly limit the scope of the claims. One of ordinary skill in the art would recognize many variations, alternatives, and modifications.

Figure 3:
FIG. 3 is a simplified diagram showing a planar view of a photovoltaic module as part of the photovoltaic module interconnection system according to one embodiment of the present invention.
Figure 3:
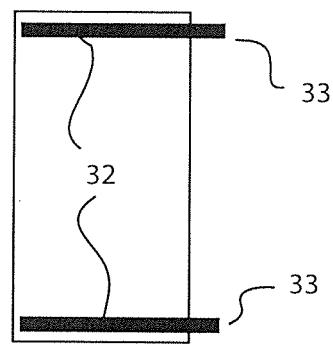

FIG. 3 is a simplified diagram showing a planar view of a photovoltaic module 51 as part of the photovoltaic module interconnection system 100 according to one embodiment of the present invention. This diagram is merely an example, which should not unduly limit the scope of the claims. One of ordinary skill in the art would recognize many variations, alternatives, and modifications. In FIG. 3, the PV module 51 includes a plurality of bus bars 32. In one example, the plurality of bus bars 32 are the plurality of bus bars 52. In another example, each PV module 51 includes two bus bars 32 coupled to the positive and negative ends of the array of photovoltaic cells included in the PV module 51.

In some embodiments, the PV module includes a plurality of interconnect tabs 33 that extend beyond the edge of the PV module 51 and protrude from a side of the PV module 51. In other embodiments, the plurality of interconnect tabs 33 are the plurality of interconnect tabs 53. In yet another embodiment, the each of the plurality of interconnect tabs 33 is an extension of the respective bus bar 32. In yet another embodiment, each of the plurality of interconnect tabs 33 is an additional conductor. In yet another embodiment, the plurality of interconnect tabs 33 are not rated to be weatherproof as assembled in the factory, but are potted (e.g., cemented) in a weatherproof package at the installation site. In yet another embodiment, each of the plurality of interconnect tabs 33 is coated at least partially with an electrically protective film.

Figure 4:
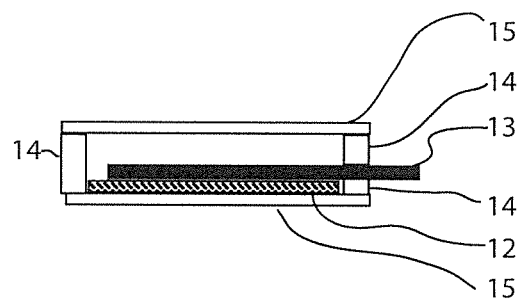
FIG. 4 is a simplified diagram showing a side view of a photovoltaic module as part of the photovoltaic module interconnection system according to another embodiment of the present invention.

FIG. 4 is a simplified diagram showing a side view of a photovoltaic module 51 as part of the photovoltaic module interconnection system 100 according to another embodiment of the present invention. This diagram is merely an example, which should not unduly limit the scope of the claims. One of ordinary skill in the art would recognize many variations, alternatives, and modifications. As shown in FIG. 4, the PV module 51 includes a photovoltaic panel 12 that includes active and conductive layers. For example, the photovoltaic panel 12 includes any material such as silicon, cadmium telluride, CIGS, organics, and/or other photovoltaic active materials. In another example, the photovoltaic module 51 includes a plurality of interconnect tabs 13. In yet another example, the plurality of interconnect tabs 13 are the plurality of interconnect tabs 33 and/or the plurality of interconnect tabs 53. In yet another example, each of the plurality of interconnect tabs 13 is an extension of a respective bus bar connected to the photovoltaic panel 12. In yet another example, each of the plurality of interconnect tabs 13 is a separate conductor from the respective bus bar. In yet another example, each of the plurality of interconnect tabs 13 is coated at least partially with an electrically protective film.

In one embodiment, the PV module 51 includes a first encapsulating material 15 protecting a front panel surface and a back panel surface of the photovoltaic panel 12 from the environment. For example, the first encapsulating material 15 includes glass, foil, polymer, and/or a laminate of multiple materials. In another example, the front panel surface is designed to face a light source (e.g., the sun) in order to generate power. In another embodiment, the PV module 51 includes a second encapsulating material 14 around a plurality of edge surfaces of the photovoltaic panel 12 for protecting the photovoltaic panel 12 from the environment. In one example, the second encapsulating material 14 includes a polymer and/or other mixture of materials selected to minimize the damage to the photovoltaic panel 12. In yet another example, the second encapsulating material 14 is placed above or below and/or on the sides of each of the plurality of interconnect tabs 13. In yet another embodiment, the first encapsulating material 15 and/or the second encapsulating material 14 substantially encloses the photovoltaic panel 12 by, for example, covering all the surfaces of the photovoltaic panel 12 except for the locations where the interconnect tabs 13 are located. In yet another embodiment, the first encapsulating material 15 and/or the second encapsulating material 14 protects the photovoltaic panel 12 from ambient conditions outside of the PV module 51, such as moisture, abrasion, debris, and/or oxygen.

Figure 5:
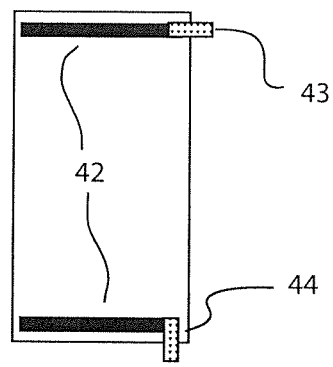
FIG. 5 is a simplified diagram showing a side view of a photovoltaic module as part of the photovoltaic module interconnection system according to yet another embodiment of the present invention

FIG. 5 is a simplified diagram showing a side view of a photovoltaic module 51 as part of the photovoltaic module interconnection system 100 according to yet another embodiment of the present invention. This diagram is merely an example, which should not unduly limit the scope of the claims. One of ordinary skill in the art would recognize many variations, alternatives, and modifications. As shown in FIG. 5, the PV module 51 includes a plurality of bus bars 42. In one example, the plurality of bus bars 42 are the plurality of bus bars 52. In another example, each PV module 51 includes two bus bars 42 coupled to the positive and negative ends of the array of photovoltaic cells included in the PV module 51. In yet another example, the PV module 51 includes an interconnect tab 43 and an interconnect tab 44. In one embodiment, the interconnect tab 43 and the interconnect tab 44 are the plurality of interconnect tabs 53. In another embodiment, the interconnect tab 43 and/or the interconnect tab 44 protrudes from the PV module 51 parallel to the bus bars 42. In yet another embodiment, the interconnect tab 43 and/or the interconnect tab 44 protrudes from the PV module 51 at some angle relative to the respective bus bar 42. In yet another embodiment, interconnect tab 43 and/or interconnect tab 44 is an extension of the respective bus bar 42. In yet another example, the interconnect tab 43 and/or the interconnect tab 44 is coated at least partially with an electrically protective film.

Figure 6:
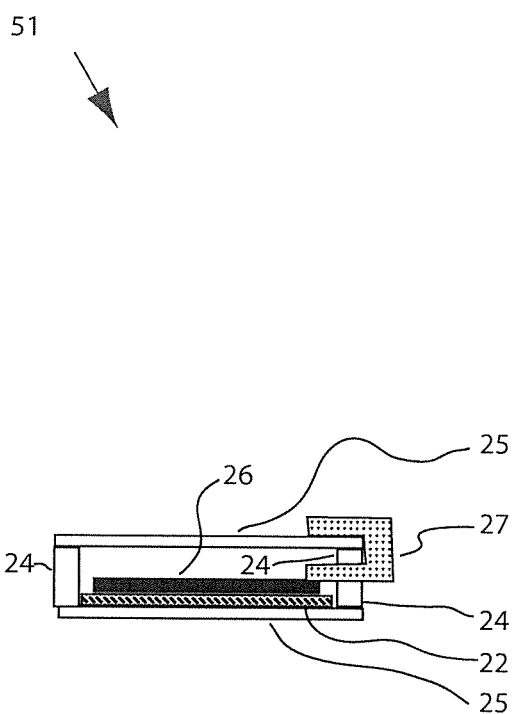
FIG. 6 is a simplified diagram showing a side view of a photovoltaic module as part of the photovoltaic module interconnection system according to yet another embodiment of the present invention.

FIG. 6 is a simplified diagram showing a side view of a photovoltaic module 51 as part of the photovoltaic module interconnection system 100 according to yet another embodiment of the present invention. This diagram is merely an example, which should not unduly limit the scope of the claims. One of ordinary skill in the art would recognize many variations, alternatives, and modifications. As shown in FIG. 6, the PV module 51 includes a photovoltaic panel 22 that includes active and conductive layers. For example, the photovoltaic panel 22 includes any material such as silicon, cadmium telluride, CIGS, organics, and/or other photovoltaic active materials. In another example, the photovoltaic module 51 includes a plurality of interconnect tabs 27. In yet another example, the plurality of interconnect tabs 27 are the plurality of interconnect tabs 53. In yet another example, each of the plurality of interconnect tabs 27 are connected to a respective bus bar 26 connected to the photovoltaic panel 12.

In one embodiment, each of the plurality of interconnect tabs 27 is composed of conductive tape and/or thin metal. In another embodiment, each of the plurality of interconnect tabs 27 protrudes from the side of the PV module 51. In yet another embodiment, each of the plurality of interconnect tabs 27 extends around the first encapsulating material 25 to a front module surface or a back module surface of the PV module 51. For example, the front module surface is designed to face a light source (e.g., the sun) in order to generate power. In yet another embodiment, the PV module 51 provides physical support for each of the plurality of interconnect tabs 27 for subsequent interconnection of multiple PV modules 51. In yet another embodiment, each of the plurality of interconnect tabs 27 is coated at least partially with an electrically protective film.

In yet another embodiment, the PV module 51 includes a first encapsulating material 25 protecting a front panel surface and a back panel surface of the photovoltaic panel 22 from the environment. For example, the first encapsulating material 25 includes glass, foil, polymer, and/or a laminate of multiple materials. In another example, the front panel surface is designed to face a light source (e.g., the sun) in order to generate power. In yet another example, the first encapsulating material 25 is the first encapsulating material 15. In yet another embodiment, the PV module 51 includes a second encapsulating material 24 around a plurality of edge surfaces of the photovoltaic panel 22 for protecting the photovoltaic panel 212 from the environment. In one example, the second encapsulating material 24 includes a polymer and/or other mixture of materials selected to minimize the damage to the photovoltaic panel 22. In yet another example, the second encapsulating material 24 is placed above or below and/or on the sides of each of the plurality of interconnect tabs 23. In yet another example, the second encapsulating material 24 is the second encapsulating material 14. In yet another embodiment, the first encapsulating material 25 and/or the second encapsulating material 24 substantially encloses the photovoltaic panel 22 by, for example, covering all the surfaces of the photovoltaic panel 22 except for the locations where the interconnect tabs 23 are located. In yet another embodiment, the first encapsulating material 25 and/or the second encapsulating material 24 protects the photovoltaic panel 22 from ambient conditions outside of the PV module 51, such as moisture, abrasion, debris, and/or oxygen.

Returning to FIGS. 1 and 2, in another embodiment, interconnection between a first PV module 51 and a second PV module is provided by the module interconnector 57. In one example, the module interconnector 57 includes an interconnection component 56 and an interconnection protector 54. In yet another embodiment, electrical interconnection between the first PV module 51 and the second PV module 51 is provided by the interconnection component 56 coupled through a first connection 55 (e.g., a first connection component) to a first interconnect tab 53 on the first PV module 51 and coupled through a second connection 55 (e.g., a second connection component) to a second interconnect tab 53 on the second PV module 51. For example, the first connection 55 and/or the second connection 55 are crimped, soldered, welded, and/or ultrasonically welded. In another example, the first connection 55 and the second connection 55 are completed in the factory and/or completed at the installation site. In yet another example, the interconnection component 56 is made of the same type of metal as the first interconnect tab 53 and the second interconnect tab 53 to reduce the potential for corrosion. In yet another embodiment, the first connection 55 and the second connection 55 are applied directly between the first interconnect tab 53 and the second interconnect tab 53 without intervening interconnection component 56.

As shown in FIGS. 1 and 2, environmental protection for the electrical interconnection is provided by interconnection protector 54. For example, the interconnection protector 54 also provides environmental protection for the interface of the interconnect tabs 53 and the PV modules 51. In another example, the interconnection protector 54 substantially encloses the interconnection component 56, the first connection 55, and the second connection 55, but, for example, provides access points for the first interconnect tab 53 and the second interconnect tab 54. In yet another example, the interconnection component 56, the first connection 55, and the second connection 55 are potted (e.g., cemented) in place inside the interconnection protector 54 using one or more potting materials. In yet another example, the one or more potting materials fill a volume inside the interconnection protector 54 that is not occupied by the interconnection component 56, the first connection 55, and the second connection 55. In yet another example, the one or more potting materials include a liquid encapsulant. In yet another example, the one or more potting materials include room temperature vulcanizing silicone and/or epoxy. In yet another example, the interconnection protector 54 provides physical strain relief for the interconnection component 56, the first connection 55, the second connection 55, the first interconnect tab 53, and/or the second interconnect tab 53.

According to another embodiment, the interconnection protector 54 and the interconnection component 56 provide strain relief to reduce strain during thermal expansion of the PV modules 51 and/or the system that holds the PV modules 51 in place. For example, interconnection component 56 includes a thin sheet of metal with accordion folds (e.g., accordion bends) to allow lengthening and shortening, potted in soft polymer inside the interconnection protector 54. In another example, the interconnection component 56 includes a flexible cable with slack to allow for expansion and contraction.

According to yet another embodiment, the interconnection protector 54 also provides sufficient safety to prevent accidental contact to electrical conductors (e.g., the interconnection component 56) at up to several thousand volts. For example, the interconnect tabs 53 are provided with an electrically protective film to prevent electrical shock that is subsequently removed or pierced during assembly of connections 55.

According to yet another embodiment, the connections 55, the interconnection component 56, and the interconnection protector 54 are installed on a group of modules 51 in a factory, for shipping a partially pre-assembled set of PV modules 51 to the installation site. For example, the module interconnector 57 allows a 180 degree bend to permit front-to-front and/or back-to-back folding of PV modules 51 in a shipping container. In another example, the folded PV modules 51 can subsequently be rapidly and/or automatically unfolded at the installation site.

According to yet another embodiment, the interconnection protector 54 is composed of harder polymer on the outside for environmental protection, and softer polymer on the inside to allow for thermal expansion. For example, the interconnection protector 54 is filled with liquid and/or grease. In another example, the softer material inside the interconnection protector 54 is filled and/or cured in the factory and/or at the installation site.

According to yet another embodiment, the interconnection protector 54 allows the interconnection of the PV module 51 with a wiring harness at the end of a string of PV modules 51.

According to yet another embodiment, the interconnection protector 54 extends on a front module surface (e.g., the light side) of the PV module 51 but does not block the module active area from being exposed to sunlight. For example, the interconnection protector 54 extends around the back module surface (e.g., the dark side) of the PV module 51 for added mechanical strength and/or environmental protection. In another example, the interconnection protector 54 provides a surface and/or a mating component for physically mounting the PV module 51 to a racking system with sufficient strength to resist forces such as gravity and wind loading.

In yet another embodiment, the interconnection protector 54 provides a semi-permanent interconnection. In one example, to replace the PV module 51 at the installation site, it may be needed to cut the interconnection component 56 and re-join the cut interconnection component 56 with another interconnection component 56 using solder, welding, ultrasonic welding and/or crimping. In yet another example, the interconnection component 56 is provided with extra length to simplify the process of cutting and re-joining. In one embodiment, the semi-permanent connection provided by the module interconnector 57 results in overall cost savings in a large photovoltaic installation. In another embodiment, replacing a module at the installation site is rare, so the cost savings by eliminating push-to-connect connectors is more than adequate to make up for the extra effort required to cut and re-join the interconnection component 56.

According to yet another embodiment, without bulky connectors, PV modules 51 can be packed closely together for volume-efficient shipping to the installation site. For example, shipping two 6-mm-thick typical modules, with 12 mm thick connectors, needs a minimum width of 24 mm in a packing container. In another example, shipping two 6-mm-thick modules, with improved interconnections, needs a minimum width of 12 mm in a packing container, double the packing density of a typical module. In yet another example, pre-assembled sets of folded PV modules 51, as described herein, are provided for faster installation at the installation site.

Figure 7:
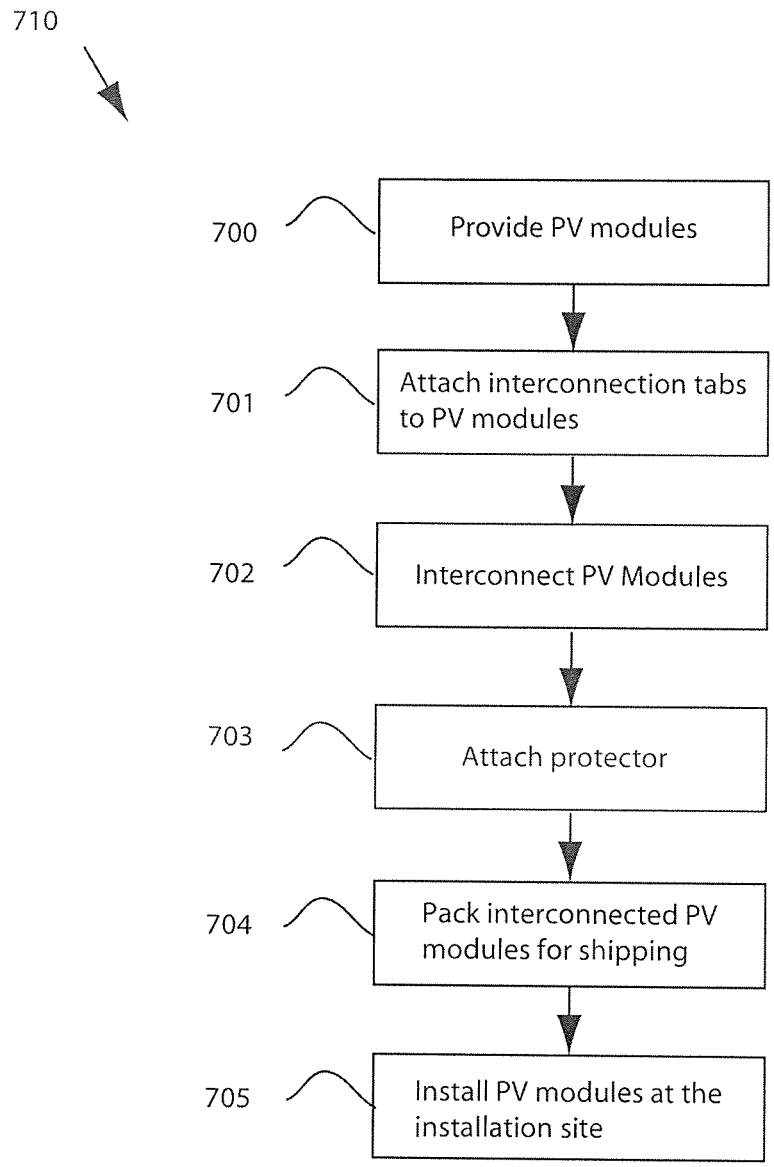
FIG. 7 is a simplified diagram showing a method for installing photovoltaic modules using the photovoltaic module interconnection system according to one embodiment of the present invention.

FIG. 7 is a simplified diagram showing a method for installing photovoltaic modules 51 using the photovoltaic module interconnection system 100 according to one embodiment of the present invention. This diagram is merely an example, which should not unduly limit the scope of the claims. One of ordinary skill in the art would recognize many variations, alternatives, and modifications. As shown in FIG. 7, the method 710 includes a process 700 for providing PV modules; a process 701 for attaching interconnection tabs to PV modules; a process 702 for interconnecting PV modules; a process 703 for attaching interconnection protectors; a process 704 for packing interconnected PV modules for shipping; and a process 705 for installing PV modules at the installation site. According to certain embodiments, the method 710 of installing PV modules 51 using the photovoltaic module interconnection system 100 can be performed using variations among the processes 700-705 as would be recognized by one of ordinary skill in the art.

At the process 700, PV modules 51 according to one or more embodiments of the present invention are provided. For example, PV modules 51 with the plurality of bus bars 52 are provided. In another example, the PV modules 51 include encapsulating materials (e.g., the first encapsulating material 15 or 25 and/or the second encapsulating material 14 or 24).

At the process 701, the plurality of interconnection tabs 53 are attached to the PV modules 51. In one example, each of the plurality of interconnection tabs are an extension of the respective bus bar 52. In another example, each of the plurality of interconnection tabs 53 are a separate conductor connected to the end of the respective bus bar 52. In yet another example, each of the plurality of interconnection tabs 53 are attached either parallel to or at some other angle to the respective bus 52. In yet another example, each of the plurality of interconnect tabs 53 is coated at least partially with an electrically protective film.

At the process 702, the PV modules 51 are interconnected. In one example, a first interconnection tab 53 from a first PV module 51 is electrically connected to a second interconnection tab 53 from a second PV module 51 using a interconnection component 56 using connections 55. In another example, the first interconnection tab 53 from the first PV module 51 is electrically connected to the second interconnection tab 53 from the second PV module 51 without intervening interconnection component 56.

At the process 703, the interconnection protector 54 is attached at each interconnection point. For example, the interconnection protector 54 is attached over the interconnection component 56 and/or the connections 55. In another example, the interconnection protector 54 is potted in place. In yet another example, the interconnection component 56, the first connection 55, and the second connection 55 are potted in place inside the interconnection protector 54 using one or more potting materials. In yet another example, the one or more potting materials are injected into a volume inside the interconnection protector 54 that is not occupied by the interconnection component 56, the first connection 55, and the second connection 55. In yet another example, the one or more potting materials include a liquid encapsulant. In yet another example, the one or more potting materials subsequently cure to form a weatherproof layer. In yet another example, the one or more potting materials include room temperature vulcanizing silicone and/or epoxy.

At the process 704, the interconnected PV modules 51 are packed for shipping. In one example, the PV modules 51 are folded front-to-front and/or back-to-back at each interconnection point. In another example, the PV modules are packed in a shipping container.

At the process 705, the PV modules 51 are installed at the installation site. In one example the interconnected PV modules 51 are unpacked from the shipping container. In another example, the interconnected PV modules 51 are unfolded. In yet another example, the interconnected PV modules 51 are mounted to a rail and/or some other type of mounting system at their final installation location.

As discussed above and further emphasized here, FIG. 7 is merely an example, which should not unduly limit the scope of the claims. One of ordinary skill in the art would recognize many variations, alternatives, and modifications. For example, a process for shipping, to an installation site, at least the interconnected and packed first photovoltaic module 51 and second photovoltaic module 51 occurs between the process 704 for packing interconnected PV modules for shipping and the process 705 for installing PV modules at the installation site. In another example, a process for unpacking the interconnected and packed first photovoltaic module 51 and second photovoltaic module 51 occurs between the process 704 for packing interconnected PV modules for shipping and the process 705 for installing PV modules at the installation site.

Figure 8:
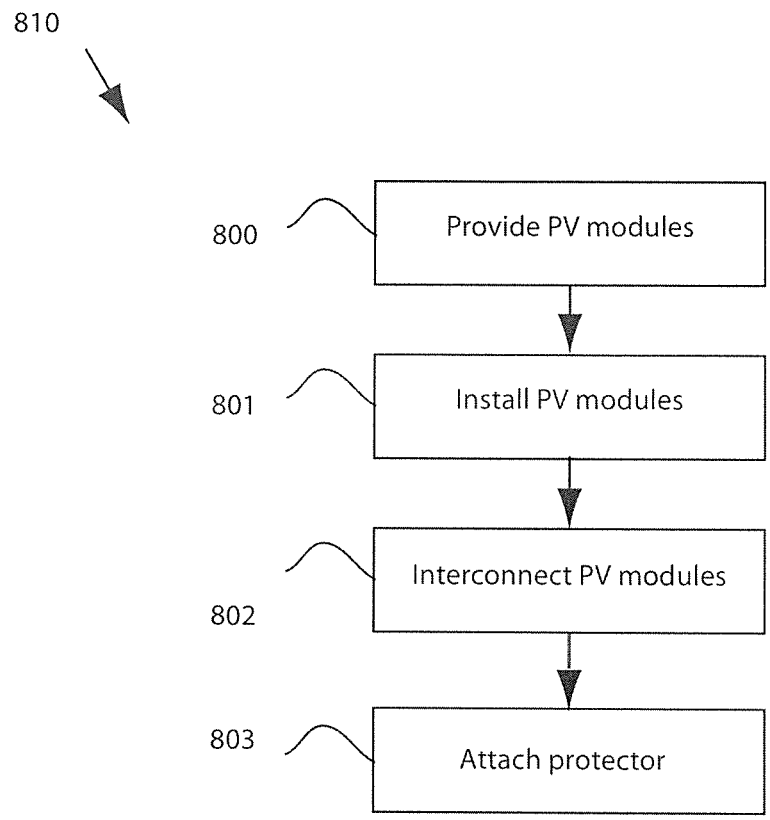
FIG. 8 is a simplified diagram showing a method for installing photovoltaic modules using the photovoltaic module interconnection system according to another embodiment of the present invention.

FIG. 8 is a simplified diagram showing a method for installing photovoltaic modules 51 using the photovoltaic module interconnection system 100 according to another embodiment of the present invention. This diagram is merely an example, which should not unduly limit the scope of the claims. One of ordinary skill in the art would recognize many variations, alternatives, and modifications. As shown in FIG. 8, the method 810 includes a process 800 for providing PV modules; a process 801 for installing PV modules; a process 802 for interconnecting PV modules; and a process 803 for attaching interconnection protectors. According to certain embodiments, the method 810 of installing PV modules 51 using the photovoltaic module interconnection system 100 can be performed using variations among the processes 800-803 as would be recognized by one of ordinary skill in the art.

At the process 800, PV modules 51 with the plurality of interconnection tabs 53 according to one or more embodiments of the present invention are provided. For example, PV modules 51 with the plurality of bus bars 52 are provided. In another example, the PV modules 51 include encapsulating materials (e.g., the first encapsulating material 15 or 25 and/or the second encapsulating material 14 or 24). In yet another example, the plurality of interconnection tabs 53 are attached to the PV modules 51. In yet another example, each of the plurality of interconnection tabs are an extension of the respective bus bar 52. In yet another example, each of the plurality of interconnection tabs 53 are a separate conductor connected to the end of the respective bus bar 52. In yet another example, each of the plurality of interconnection tabs 53 are attached either parallel to or at some other angle to the respective bus 52. In yet another example, each of the plurality of interconnect tabs 53 is coated at least partially with an electrically protective film. In yet another example, the electrically protective film prevents electrical shock during handling of the PV modules 51.

At the process 801, the PV modules 51 are installed at the installation site. In one example the interconnected PV modules 51 are unpacked from shipping containers. In another example, the interconnected PV modules 51 are mounted to a rail and/or some other type of mounting system at their final installation location.

At the process 802, the PV modules 51 are interconnected. In one example, a first interconnection tab 53 from a first PV module 51 is electrically connected to a second interconnection tab 53 from a second PV module 51 using an interconnection component 56 and connections 55. In another example, the first interconnection tab 53 from the first PV module 51 is electrically connected to the second interconnection tab 53 from the second PV module 51 without the intervening interconnection component 56. In yet another example, the electrically protective film on the first interconnection tab 53 and the electrically protective film on the second interconnection tab 53 is pierced and/or removed.

At the process 803, the interconnection protector 54 is attached at each interconnection point. For example, the interconnection protector 54 is attached over the interconnection component 56 and/or the connections 55. In another example, the interconnection protector 54 is potted in place. In yet another example, the interconnection component 56, the first connection 55, and the second connection 55 are potted in place inside the interconnection protector 54 using one or more potting materials. In yet another example, the one or more potting materials are injected to a volume inside the interconnection protector 54 that is not occupied by the interconnection component 56, the first connection 55, and the second connection 55. In yet another example, the one or more potting materials include a liquid encapsulant. In yet another example, the one or more potting materials subsequently cure to form a weatherproof layer. In yet another example, the one or more potting materials include room temperature vulcanizing silicone and/or epoxy.

As discussed above and further emphasized here, FIG. 8 is merely an example, which should not unduly limit the scope of the claims. One of ordinary skill in the art would recognize many variations, alternatives, and modifications. For example, a process for packing, for shipping, at least the first photovoltaic module 51 and second photovoltaic module 51 occurs between the process 800 for providing PV modules and the process 801 for installing PV modules. In another example, a process for shipping, to an installation site, at least the first photovoltaic module 51 and second photovoltaic module 51 occurs between the process 800 for providing PV modules and the process 801 for installing PV modules. In yet another example, a process for unpacking the packed first photovoltaic module 51 and second photovoltaic module 51 occurs between the process 800 for providing PV modules and the process 801 for installing PV modules.

According to at least one embodiment, a system for interconnecting photovoltaic modules includes a first photovoltaic module and a second photovoltaic module. The first photovoltaic module includes a first bus bar and a first interconnect tab connected to the first bus bar. The second photovoltaic module includes a second bus bar and a second interconnect tab connected to the second bus bar. The system for interconnecting photovoltaic modules additionally includes a module interconnector configured to interconnect the first photovoltaic module and the second photovoltaic module. The module interconnector includes an interconnection component and an interconnection protector. Additionally, the system for interconnecting photovoltaic modules includes a first connection component connecting the interconnection component to the first interconnect tab of the first photovoltaic module and a second connection component connecting the interconnection component to the second interconnect tab of the second photovoltaic module. The interconnection protector substantially encloses the interconnection component, the first connection component, and the second connection component. For example, the system for interconnecting photovoltaic modules is implemented according to at least FIG. 1, FIG. 2, FIG. 3, FIG. 4, FIG. 5, and/or FIG. 6.

In another example, the first photovoltaic module includes one selected from a group consisting of silicon, cadmium telluride, CIGS, and organics. In yet another example, the first photovoltaic module further includes an array of photovoltaic cells, the array of photovoltaic cells includes a positive end and a negative end and the first bus bar is coupled to either the positive end or the negative end. In yet another example, the first interconnect tab protrudes from a side of the first photovoltaic module. In yet another example, the first interconnect tab is an extension of the first bus bar. In yet another example, the first interconnect tab is a separate conductor from the first bus bar. In yet another example, the first interconnect tab protrudes from the side of the first photovoltaic module in parallel with the first bus bar. In yet another example, the first interconnect tab protrudes from the side of the first photovoltaic module at an angle to the first bus bar. In yet another example, the first interconnect tab is coated at least partially by a protective film.

In yet another example, the first photovoltaic module further includes a photovoltaic panel including a front panel surface, a back panel surface, and a plurality of edge surfaces. And the first photovoltaic module further includes a first encapsulating material for protecting the front panel surface of the photovoltaic panel and the back panel surface of the photovoltaic panel and a second encapsulating material for protecting the plurality of edge surfaces of the photovoltaic panel. Additionally, the first encapsulating material and the second encapsulating material substantially enclose the photovoltaic panel. In yet another example, the second encapsulating material is placed above, below, and to the sides of the first interconnect tab. In yet another example, the first photovoltaic module further includes a front module surface and a back module surface and the first interconnect tab extends around the first encapsulating material to the front module surface or the back module surface of the first photovoltaic module. In yet another example, the interconnection component is potted inside the protector using a polymer. In yet another example, the interconnection component includes a flexible cable. In yet another example, the interconnection component includes a thin sheet of metal including accordion folds. In yet another example, the first connection is formed by at least one selected from a group consisting of crimping, soldering, welding, and ultrasonic welding. In yet another example, the first connection component, the second connection component, and the interconnection component include the same metal. In yet another example, the interconnection protector provides electrical and environmental protection to the interconnection component, the first connection component, and the second connection component.

According to another embodiment, a method for installing photovoltaic modules includes providing a first photovoltaic module that includes a first bus bar, providing a second photovoltaic module that includes a second bus bar, attaching a first interconnect tab to the first bus bar, and attaching a second interconnect tab to the second bus bar. The method for installing photovoltaic modules further includes interconnecting the first photovoltaic module and the second photovoltaic module by connecting the first interconnect tab to an interconnection component with a first connection component and by connecting the second interconnect tab to the interconnection component with a second connection component. The method for installing photovoltaic modules additionally includes enclosing substantially the interconnection component, the first connection component, and the second connection component by an interconnection protector. The method for installing photovoltaic modules additionally includes packing, for shipping, at least the first photovoltaic module and the second photovoltaic module, the first photovoltaic module and the second photovoltaic module being interconnected to each other, shipping, to an installation site, at least the packed first photovoltaic module and second photovoltaic module, the first photovoltaic module and the second photovoltaic module being interconnected to each other, and installing, at the installation site, at least the first photovoltaic module and the second photovoltaic module. For example, the method is implemented according to at least FIG. 7.

In another example, the first photovoltaic module includes one selected from a group consisting of silicon, cadmium telluride, CIGS, and organics. In yet another example, the process for packing, for shipping, at least the first photovoltaic module and the second photovoltaic module includes stacking the first photovoltaic module and the second photovoltaic module either front-to-back or back-to-front by folding the interconnection component and the interconnection protector.

According to yet another embodiment, a method for installing photovoltaic modules includes providing a first photovoltaic module that includes a first bus bar and a first interconnect tab connected to the first bus bar and providing a second photovoltaic module that includes a second bus bar and a second interconnect tab connected to the second bus bar. The method for installing photovoltaic modules further includes coating the first interconnect tab at least partially with a first protective film and coating the second interconnect tab at least partially with a second protective film. The method for installing photovoltaic modules additionally includes packing, for shipping, at least the first photovoltaic module and the second photovoltaic module, shipping, to an installation site, at least the packed first photovoltaic module and second photovoltaic module, and installing, at the installation site, at least the first photovoltaic module and the second photovoltaic module. The method for installing photovoltaic modules additionally includes interconnecting, at the installation site, the installed first photovoltaic module and the installed second photovoltaic module by connecting the first interconnect tab to an interconnection component with a first connection component and by connecting the second interconnect tab to the interconnection component with a second connection component. The method for installing photovoltaic modules additionally includes enclosing substantially the interconnection component, the first connection component, and the second connection component with an interconnection protector. For example, the method is implemented according to at least FIG. 8.

In another example, the first photovoltaic module includes one selected from a group consisting of silicon, cadmium telluride, CIGS, and organics. In yet another example, the process for interconnecting, at the installation site, the installed first photovoltaic module and the installed second photovoltaic module includes piercing the first protective film and piercing the second protective film. In yet another example, the process for interconnecting, at the installation site, the installed first photovoltaic module and the installed second photovoltaic module removing the first protective film and removing the second protective film.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A system, comprising:
a first photovoltaic module including front and back surfaces and a plurality of edge surfaces, a first bus bar, and a first interconnect tab connected to the first bus bar, the first interconnect tab comprising a first conductor protruding through and extending beyond at least one of the edge surfaces of the first photovoltaic module and extending beyond both the front surface and the back surface of the first photovoltaic module, the first photovoltaic module configured to generate electricity responsive to sunlight irradiating the front surface or the back surface, or both of the front and back surfaces, of the first photovoltaic module;
a second photovoltaic module including front and back surfaces and a plurality of edge surfaces, a second bus bar, and a second interconnect tab connected to the second bus bar, the second interconnect tab comprising a second conductor protruding through and extending beyond at least one of the edge surfaces of the second photovoltaic module and extending beyond both the front surface and the back surface of the second photovoltaic module, the second photovoltaic module configured to generate electricity responsive to sunlight irradiating the front surface or the back surface, or both of the front and back surfaces, of the second photovoltaic module;
a third conductor comprising an elongated body defining first and second ends, the first end being in electrical contact with the first conductor, the second end being in electrical contact with the second conductor; and
a singular-bodied interconnection protector that completely encloses each of the third conductor, the first conductor, the second conductor, the electrical contact between the first end and the first conductor, the electrical contact between the second end and the second conductor, an exterior region of the front surface of the first photovoltaic module, an exterior region of the back surface of the first photovoltaic module, an exterior region of at least one of the edge surfaces of the first photovoltaic module, an exterior region of the front surface of the second photovoltaic module, an exterior region of the back surface of the second photovoltaic module, and an exterior region of the at least one of the edge surfaces of the second photovoltaic module; and
one or more potting materials that fill a volume inside the singular-bodied interconnection protector that is not occupied by the third conductor, the first conductor, the second conductor, the electrical contact between the first end and the first conductor, the electrical contact between the second end and the second conductor, the exterior region of the front surface of the first photovoltaic module, the exterior region of the back surface of the first photovoltaic module, the exterior region of the at least one of the edge surfaces of the first photovoltaic module, the exterior region of the front surface of the second photovoltaic module, the exterior region of the back surface of the second photovoltaic module, and the exterior region of the at least one of the edge surfaces of the second photovoltaic module.

2. The system of claim 1 wherein the first photovoltaic module includes one selected from a group consisting of silicon, cadmium telluride, CIGS, and organics.

3. The system of claim 1 wherein:
the first photovoltaic module further includes an array of photovoltaic cells, the array of photovoltaic cells including a positive end and a negative end; and
the first bus bar is coupled to either the positive end or the negative end.

4. The system of claim 1 wherein the first interconnect tab is a portion of the first bus bar.

5. The system of claim 1 wherein the first interconnect tab is a separate conductor from the first bus bar.

6. The system of claim 1 wherein the first interconnect tab protrudes through and extends beyond the at least one of the edge surfaces of the first photovoltaic module in parallel with the first bus bar.

7. The system of claim 1 wherein the first interconnect tab protrudes through and extends beyond the at least one of the edge surfaces of the first photovoltaic module at an angle to the first bus bar.

8. The system of claim 1 wherein the first interconnect tab is coated at least partially by a protective film.

9. The system of claim 1 wherein the first photovoltaic module further includes:
an encapsulating material sealing the edge surfaces of the first photovoltaic module, the first interconnect tab protruding through and extending beyond the encapsulating material.

10. The system of claim 1 wherein:
a portion of the first interconnect tab extends to the front surface or the back surface of the first photovoltaic module.

11. The system of claim 1 wherein the potting materials comprises a polymer.

12. The system of claim 1 wherein the elongated body is flexible.

13. The system of claim 1 wherein the first end is coupled to the first interconnect tab using crimping, soldering, welding, or ultrasonic welding.

14. The system of claim 1, further comprising:
a first connection component connecting the third conductor to the first interconnect tab of the first photovoltaic module; and
a second connection component connecting the third conductor to the second interconnect tab of the second photovoltaic module.

15. The system of claim 14 wherein the first connection component, the second connection component, and the third conductor include the same metal as one another.

16. The system of claim 14 wherein the one or more potting materials provide electrical and environmental protection to the elongated body, the first conductor, and the second conductor.

17. The system of claim 1, wherein the first and second conductors each are flat.

18. The system of claim 1, wherein the elongated body of the third conductor is continuous between the first and second ends.

19. A method for installing photovoltaic modules, comprising:
providing a first photovoltaic module including front and back surfaces and a plurality of edge surfaces, a first bus bar, and a first interconnect tab connected to the first bus bar, the first interconnect tab comprising a first conductor protruding through and extending beyond at least one of the edge surfaces of the first photovoltaic module and extending beyond both the front surface and the back surface of the first photovoltaic module, the first photovoltaic module configured to generate electricity responsive to sunlight irradiating the front surface or the back surface, or both of the front and back surfaces, of the first photovoltaic module;
providing a second photovoltaic module including front and back surfaces and a plurality of edge surfaces, a second bus bar, and a second interconnect tab connected to the second bus bar, the second interconnect tab comprising a second conductor protruding through and extending beyond at least one of the edge surfaces of the second photovoltaic module and extending beyond both the front surface and the back surface of the second photovoltaic module, the second photovoltaic module configured to generate electricity responsive to sunlight irradiating the front surface or the back surface, or both of the front and back surfaces, of the second photovoltaic module;
interconnecting the first photovoltaic module and the second photovoltaic module with a third conductor comprising an elongated body defining first and second ends, the first end being in electrical contact with the first conductor, the second end being in electrical contact with the second conductor;
completely enclosing, with a singular-bodied interconnection protector, each of the third conductor, the first conductor, the second conductor, the electrical contact between the first end and the first conductor, the electrical contact between the second end and the second conductor, an exterior region of the front surface of the first photovoltaic module, an exterior region of the back surface of the first photovoltaic module, an exterior region of the at least one of the edge surfaces of the first photovoltaic module, an exterior region of the front surface of the second photovoltaic module, an exterior region of the back surface of the second photovoltaic module, and an exterior region of the at least one of the edge surfaces of the second photovoltaic module;
filling, with one or more potting materials, a volume inside the singular-bodied interconnection protector that is not occupied by the third conductor, the first conductor, the second interconnect tab, the electrical contact between the first end and the first conductor, the electrical contact between the second end and the second conductor, the exterior region of the front surface of the first photovoltaic module, the exterior region of the back surface of the first photovoltaic module, the exterior region of the at least one of the edge surfaces of the first photovoltaic module, the exterior region of the front surface of the second photovoltaic module, the exterior region of the back surface of the second photovoltaic module, and the exterior region of the at least one of the edge surfaces of the second photovoltaic module;
packing, for shipping, at least the interconnected first photovoltaic module and the second photovoltaic module, the first photovoltaic module and the second photovoltaic module being interconnected to each other via the third conductor, the singular-bodied interconnection protector, and the one or more potting materials;
shipping, to an installation site, at least the packed first photovoltaic module and second photovoltaic module, the first photovoltaic module and the second photovoltaic module being interconnected to each other via the third conductor, the singular-bodied interconnection protector, and the one or more potting materials; and
installing, at the installation site, at least the shipped first photovoltaic module and the second photovoltaic module being interconnected to each other via the third conductor, the singular-bodied interconnection protector, and the one or more potting materials.

20. The method of claim 19 wherein the first photovoltaic module includes one selected from a group consisting of silicon, cadmium telluride, CIGS, and organics.

21. The method of claim 19 wherein the process for packing, for shipping, at least the first photovoltaic module and the second photovoltaic module includes stacking the first photovoltaic module and the second photovoltaic module either front-to-back or back-to-front by folding the third conductor and the singular-bodied interconnection protector.

22. A method for installing photovoltaic modules, comprising:
providing a first photovoltaic module including front and back surfaces and a plurality of edge surfaces, a first bus bar, and a first interconnect tab connected to the first bus bar, the first interconnect tab comprising a first conductor protruding through and extending beyond at least one of the edge surfaces of the first photovoltaic module and extending beyond both the front surface and the back surface of the first photovoltaic module, the first photovoltaic module configured to generate electricity responsive to sunlight irradiating the front surface or the back surface, or both of the front and back surfaces, of the first photovoltaic module;
providing a second photovoltaic module including front and back surfaces and a plurality of edge surfaces, a second bus bar, and a second interconnect tab connected to the second bus bar, the second interconnect tab comprising a second conductor protruding through and extending beyond at least one of the edge surfaces of the second photovoltaic module and extending beyond both the front surface and the back surface of the second photovoltaic module, the second photovoltaic module configured to generate electricity responsive to sunlight irradiating the front surface or the back surface, or both of the front and back surfaces, of the second photovoltaic module;

packing, for shipping, at least the first photovoltaic module and the second photovoltaic module;

shipping, to an installation site, at least the packed first photovoltaic module and second photovoltaic module; and installing, at the installation site, at least the first photovoltaic module and the second photovoltaic module;

interconnecting, at the installation site, the installed first photovoltaic module and the installed second photovoltaic module with a third conductor comprising an elongated body defining first and second ends, the first end being in electrical contact with the first conductor, the second end being in electrical contact with the conductor;

completely enclosing, with a singular-bodied interconnection protector, each of the third conductor, the first conductor, the second conductor, the electrical contact between the first end and the first conductor, the electrical contact between the second end and the second conductor, an exterior region of the front surface of the first photovoltaic module, an exterior region of the back surface of the first photovoltaic module, an exterior region of the at least one of the edge surfaces of the first photovoltaic module, an exterior region of the front surface of the second photovoltaic module, an exterior region of the back surface of the second photovoltaic module, and an exterior region of the at least one of the edge surfaces of the second photovoltaic module; and filling, with one or more potting materials, a volume inside the singular-bodied interconnection protector that is not occupied by the third conductor, the first conductor, the second conductor, the electrical contact between the first end and the first conductor, the electrical contact between the second end and the second conductor, the exterior region of the front surface of the first photovoltaic module, the exterior region of the back surface of the first photovoltaic module, the exterior region of the at least one of the edge surfaces of the first photovoltaic module, the exterior region of the front surface of the second photovoltaic module, the exterior region of the back surface of the second photovoltaic module, and the exterior region of the at least one of the edge surfaces of the second photovoltaic module.

23. The method of claim 22 wherein the first photovoltaic module includes one selected from a group consisting of silicon, cadmium telluride, CIGS, and organics.

24. The method of claim 22 wherein, prior to packing, the first interconnect tab is at least partially coated with a first protective film and the second interconnect tab is at least partially coated with a second protective film, and wherein the process for interconnecting, at the installation site, the installed first photovoltaic module and the installed second photovoltaic module includes piercing the first protective film and piercing the second protective film.

25. The method of claim 22 wherein, prior to packing, the first interconnect tab is at least partially coated with a first protective film and the second interconnect tab is at least partially coated with a second protective film, and wherein the process for interconnecting, at the installation site, the installed first photovoltaic module and the installed second photovoltaic module removing the first protective film and removing the second protective film.

* * * * *